United States Patent
Kaneko et al.

(10) Patent No.: US 10,081,033 B2
(45) Date of Patent: Sep. 25, 2018

(54) HEAT EXCHANGE SYSTEM, AND SUBSTRATE PROCESSING APPARATUS HAVING SAME

(71) Applicant: Tokyo Electron Limited, Tokyo (JP)

(72) Inventors: Satoshi Kaneko, Koshi (JP); Kazuki Motomatsu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 671 days.

(21) Appl. No.: 14/591,107

(22) Filed: Jan. 7, 2015

(65) Prior Publication Data

US 2015/0190838 A1     Jul. 9, 2015

(30) Foreign Application Priority Data

Jan. 8, 2014   (JP) ................ 2014-001608

(51) Int. Cl.
  *B05C 11/10*   (2006.01)
  *H01L 21/67*   (2006.01)

(52) U.S. Cl.
  CPC .... *B05C 11/1042* (2013.01); *H01L 21/67017* (2013.01)

(58) Field of Classification Search
  None
  See application file for complete search history.

(56) References Cited

U.S. PATENT DOCUMENTS

| | | | | |
|---|---|---|---|---|
| 6,026,896 | A * | 2/2000 | Hunter | F28D 15/00 165/206 |
| 7,235,137 | B2 * | 6/2007 | Kitayama | C30B 31/14 118/712 |
| 7,818,972 | B2 * | 10/2010 | Hatta | H01L 21/67098 62/238.1 |

(Continued)

FOREIGN PATENT DOCUMENTS

| JP | 49-125957 U1 | 2/1973 |
| JP | 57-207746 A | 12/1982 |

(Continued)

OTHER PUBLICATIONS

Machine Generated English Translation of JP2012-132574A. Published Jul. 12, 2012.*

(Continued)

*Primary Examiner* — Sylvia MacArthur
(74) *Attorney, Agent, or Firm* — Pearne & Gordon LLP

(57) ABSTRACT

A heat exchange system 62 includes heat exchangers 69a and 69b that heat or cool a fluid passing therethrough; a fluid supply unit 81 that supplies the heating target fluid or the cooling target fluid into lower portions thereof; and a fluid discharge unit 82 that discharges the heated fluid or the cooled fluid from upper portions thereof. The fluid supply unit includes inlet lines 85 and 86 through which the fluid is introduced; a first manifold 87 located above the upper end portion of the heat exchangers and connected with the inlet lines; a gas exhaust line 88 that is connected to the first manifold and exhausts a gas mixed in the fluid; a supply line (Continued)

89 that supplies the fluid from the first manifold. While passing through the heat exchangers from the lower portions toward the upper portions thereof, the fluid is heated or cooled.

8 Claims, 3 Drawing Sheets

(56) References Cited

U.S. PATENT DOCUMENTS

| | | | |
|---|---|---|---|
| 2008/0236561 A1* | 10/2008 | Kaiser | F24H 1/0027 126/116 C |
| 2013/0171831 A1* | 7/2013 | Namba | H01L 21/02087 438/748 |
| 2015/0190838 A1* | 7/2015 | Kaneko | H01L 21/67017 165/104.28 |

FOREIGN PATENT DOCUMENTS

| | | | | |
|---|---|---|---|---|
| JP | 61089689 A | * | 5/1986 | |
| JP | 2000-144438 A | | 5/2000 | |
| JP | 2012132574 A | * | 7/2012 | F28F 13/12 |
| JP | 2013-010994 A | | 1/2013 | |
| JP | 2013010994 A | * | 1/2013 | C23C 18/168 |
| JP | 2013-024553 A | | 2/2013 | |

OTHER PUBLICATIONS

Machine Generated English Translation of JP2013-010994. Published Jan. 17, 2013.*

Machine Generated English Translation of JP61089689A held to Chiyan Shiyuu Rii. May 7, 1986.*

* cited by examiner

HEAT EXCHANGE SYSTEM, AND SUBSTRATE PROCESSING APPARATUS HAVING SAME

CROSS-REFERENCE TO RELATED APPLICATION

This application claims the benefit of Japanese Patent Application No. 2004-001608 filed on Jan. 8, 2014 the entire disclosures of which are incorporated herein by reference.

TECHNICAL FIELD

The embodiments described herein pertain generally to a heat exchange system for heating or cooling a fluid such as a substrate processing fluid, and also relate to a substrate processing apparatus including this heat exchange system.

BACKGROUND

Conventionally, in a substrate processing apparatus for manufacturing semiconductor components, flat panel displays, or the like, various kinds of processes such as cleaning, etching and plating are performed on a substrate such as a semiconductor wafer or a LCD (Liquid Crystal Display) substrate by using a processing liquid heated or cooled to a preset temperature in a heat exchanger.

As an example, in a substrate processing apparatus that performs a plating process on a circuit pattern formed on a surface of a substrate, a forwarding path equipped with a heating heat exchanger and a returning path equipped with a cooling heat exchanger are provided between a storage tank that stores therein a processing liquid (plating liquid) for processing the substrate and a substrate processing unit that processes the substrate.

In this conventional substrate processing apparatus, the processing liquid of a room temperature stored in the storage tank is supplied to the substrate processing unit after heated to a preset temperature in the heating heat exchanger, and the plating process is performed on the substrate by using the heated processing liquid within the substrate processing unit (see, for example, Patent Document 1). Since the heated processing liquid is deteriorated by heat, it is cooled to the room temperature in the cooling heat exchanger and then returned back into the storage tank.

Patent Document 1: Japanese Patent Laid-open Publication No. 2013-010994

In the conventional substrate processing apparatus, if the fluid (plating liquid) remains at a high temperature after used in the substrate processing unit, the fluid may be deteriorated by heat, and a subsequent substrate process may not be performed effectively. Therefore, the high-temperature fluid needs to be cooled rapidly by the heat exchanger.

However, in the conventional heat exchanger, when the fluid passes through an inside of the heat exchanger downwards, a gas is mixed in the fluid, i.e., so-called "aeration" occurs. As a result, the heat transfer is affected by the mixed gas, and the efficiency of the heat exchanger is degraded, resulting in a failure to cool the high-temperature fluid rapidly.

SUMMARY

In one example embodiment, a heat exchange system includes at least one heat exchanger configured to heat or cool a fluid passing therethrough; a fluid supply unit configured to supply the heating target fluid or the cooling target fluid into a lower portion of the at least one heat exchanger; and a fluid discharge unit configured to discharge the heated fluid or the cooled fluid from an upper portion of the at least one heat exchanger. The fluid supply unit includes at least one inlet line through which the fluid is introduced; a first manifold provided at a position higher than an upper end of the at least one heat exchanger and connected with the at least one inlet line; a gas exhaust line connected to the first manifold and configured to exhaust a gas mixed in the fluid; and a supply line configured to supply the fluid into the at least one heat exchanger from the first manifold. The fluid is heated or cooled while passing through an inside of the at least one heat exchanger upwards from the lower portion of the at least one heat exchanger toward the upper portion thereof.

The fluid supply unit may be configured to supply the fluid into the lower portion of the at least one heat exchanger by a weight of the fluid.

The fluid discharge unit may include a gas supply line configured to supply a gas into the fluid.

The at least one inlet line may be plural in number, and the fluid supply unit may include the inlet lines through which the fluid is introduced; the first manifold connected with the inlet lines; and the supply line configured to supply the fluid into the at least one heat exchanger from the first manifold.

The at least one heat exchanger may be plural in number, and the fluid supply unit may include the supply line configured to supply the fluid; a second manifold connected with the supply line; and branch lines branched from the second manifold and configured to supply the fluid into the heat exchangers, respectively.

The at least one heat exchanger may be plural in number, and the fluid discharge unit may include branch lines connected to the heat exchangers, respectively; a third manifold connected with the branch lines; and a single discharge line connected to the third manifold.

The fluid supply unit may include the supply line configured to supply the fluid; a second manifold connected with the supply line; and branch lines branched from the second manifold and configured to supply the fluid into the heat exchangers, respectively. Further, the fluid discharge unit may include branch lines connected to the heat exchangers, respectively; a third manifold connected with the branch lines; and a discharge line connected to the third manifold. Moreover, lengths of flow paths of the fluids flowing from the supply line to the discharge line in all of the heat exchangers may be set to be the same.

In another example embodiment, a substrate processing apparatus has a heat exchange system of heating or cooling a fluid for processing a substrate. The heat exchange system includes a heat exchanger configured to heat or cool a fluid passing therethrough; a fluid supply unit configured to supply the heating target fluid or the cooling target fluid into a lower portion of the heat exchanger; and a fluid discharge unit configured to discharge the heated fluid or the cooled fluid from an upper portion of the heat exchanger. Further, the fluid supply unit includes an inlet line through which the fluid is introduced; a first manifold provided at a position higher than an upper end of the heat exchanger and connected with the inlet line; a gas exhaust line connected to the first manifold and configured to exhaust a gas mixed in the fluid; and a supply line configured to supply the fluid into the heat exchanger from the first manifold. Furthermore, the fluid is heated or cooled while passing an inside of the heat exchanger upwards from the lower portion of the heat exchanger toward the upper portion thereof.

The fluid supply unit may be configured to supply the fluid used in a substrate processing unit configured to process a substrate into the lower portion of the heat exchanger by a weight of the fluid.

According to the example embodiments, a gas can be suppressed from being mixed into a heating target fluid or a cooling target fluid within the heat exchanger. Accordingly, the efficiency of heating or cooling the fluid through the heat exchanger can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
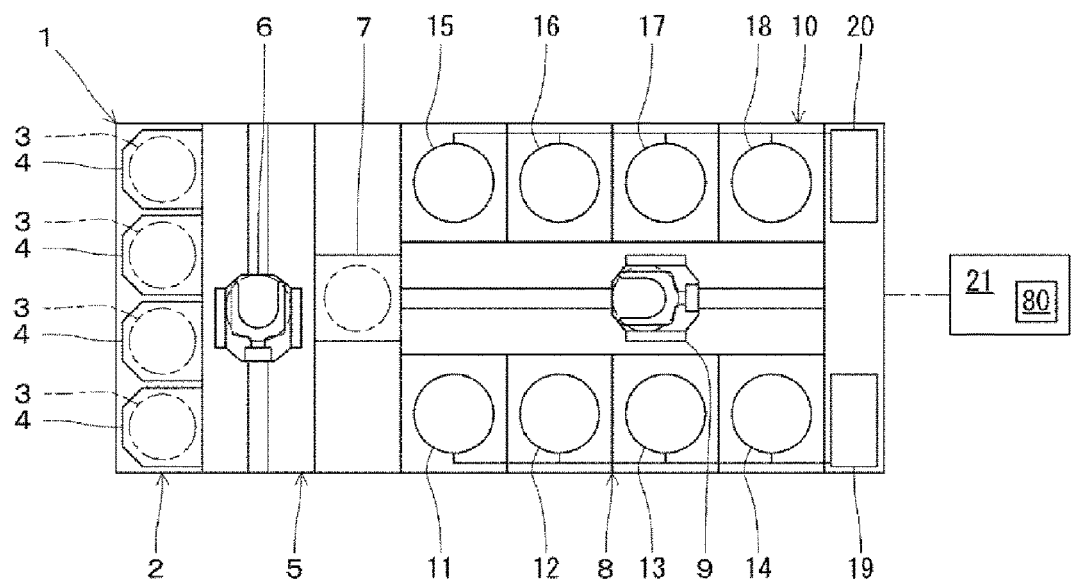
FIG. 1 is a plane view illustrating a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a detailed configuration of a substrate processing apparatus in accordance with an example embodiment will be described with reference to the accompanying drawings, which form a part of the description.

As depicted in FIG. 1, a substrate processing apparatus 1 includes a loading/unloading block 2 provided at a front end thereof. Carriers 4, each of which accommodates therein a multiple number (for example, 25 sheets) of substrates 3 (here, semiconductor wafers), are loaded into or unloaded from the loading/unloading block 2. In the loading/unloading block 2, the carriers 4 are mounted side by side in a left-and-right direction.

Further, the substrate processing apparatus 1 includes a transfer block 5 provided at the rear side of the loading/unloading block 2. The transfer block 5 incorporates a substrate transfer device 6 at a front side thereof and a substrate transit table 7 at a rear side thereof. In this transfer block 5, substrates 3 are transferred between one of the carriers 4 mounted in the loading/unloading block 2 and the substrate transit table 7 by using the substrate transfer device 6.

Provided at the rear side of the transfer block 5 within the substrate processing apparatus 1 is a processing block 8. A substrate transfer device 9 extended in a forward-backward direction is provided at a center of the processing block 8, and a plating apparatus 10 configured to perform a plating process on the substrates 3 is arranged at the left and right sides of the substrate transfer device 9. In this processing block 8, the substrate 3 is transferred between the substrate transit table 7 and the plating apparatus 10 by using the substrate transfer device 9, and a liquid process is performed on the substrates 3 by using the plating apparatus 10.

The plating apparatus 10 includes first to fourth substrate processing units 11 to 14 arranged in a forward-and-backward direction at one side of the substrate transfer device 9; and fifth to eighth substrate processing units 15 to 18 arranged in the forward-and-backward direction at the other side of the substrate transfer device 9. In the plating apparatus 10, a first processing fluid supply unit 19 is connected to the first to fourth substrate processing units 11 to 14, and a second processing fluid supply unit 20 is connected to the fifth to eighth substrate processing units 15 to 18. The first to fourth substrate processing units 11 to 14 are configured to process substrates 3 by using a processing fluid heated to a preset temperature which is supplied from the first processing fluid supply unit 19. The fifth to eighth substrate processing units 15 to 18 are configured to process substrates 3 by using the processing fluid heated to a preset temperature which is supplied from the second processing fluid supply unit 20. The first to eighth substrate processing units 11 to 18, the first and second processing fluid supply units 19 and 20, and the other individual components of the substrate processing apparatus 1 are controlled by a controller 21.

The first to eighth substrate processing units 11 to 18 have the same configuration, and the first and second processing fluid supply units 19 and 20 have the same configuration. Thus, in the following description, configurations of the first substrate processing unit 11 and the first processing fluid supply unit 19 will only be elaborated.

Figure 2:
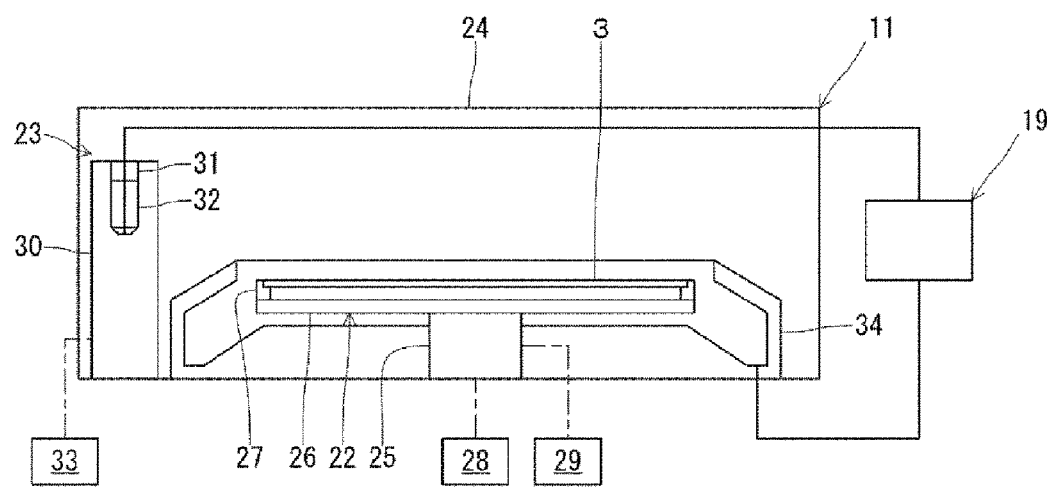
FIG. 2 is a side view illustrating a substrate processing unit.

The first substrate processing unit 11 includes, as illustrated in FIG. 2, a substrate rotating unit 22 configured to rotate a substrate 3 while holding the substrate 3 thereon; and a processing fluid discharging unit 23 configured to discharge a processing fluid (plating liquid) toward the substrate 3.

The substrate rotating unit 22 includes a vertically elongated rotation shaft 25 which is rotatably disposed at a substantially central portion of a substrate processing chamber 24. A circular plate-shaped turntable 26 is horizontally mounted on an upper end of the rotation shaft 25. A multiple number of substrate holders 27 are arranged at the edge portion of the turntable 26 at a regular interval along the circumference of the turntable 26.

Further, the substrate rotating unit 22 also includes a substrate rotating device 28 and a substrate elevating device 29 that are connected to the rotation shaft 25. Rotation of the substrate rotating device 28 and vertical movement of the substrate elevating device 29 are controlled by the control unit 21.

The substrate rotating unit 22 is configured to hold the substrate 3 thereon horizontally with the substrate holders 27 of the turntable 26. Further, the substrate rotating unit 22 is configured to rotate the substrate 3 held on the turntable 26 through the substrate rotating device 28 and move the turntable 26 and the substrate 3 up and down through the substrate elevating device 29.

The processing fluid discharging unit 23 includes a vertically extended rotation shaft 30 which is rotatably disposed at the left region of the substrate processing chamber 24. A horizontally extended arm 31 is provided on an upper end of the rotation shat 30. A nozzle 32 is provided to a lower portion of a leading end of the arm 31, facing vertically downwards. The first processing fluid supply unit 19 is connected to the nozzle 32.

The processing fluid discharging unit 23 also includes a nozzle moving device 33 connected to the rotation shaft 30. The nozzle moving device 33 is controlled by the controller 21.

The processing fluid discharging unit 23 is capable of moving the nozzle 32 between a central portion of the substrate 3 and a left-side external position outside the substrate 3 through the nozzle moving device 33, and, also, capable of discharging the processing fluid of a preset temperature, which is supplied from the first processing fluid supply unit 19, toward a surface (top surface) of the substrate 3 from the nozzle 32.

Further, a circular ring-shaped collecting cup 34 is also provided within the substrate processing chamber 24 to surround the turntable 26. The collecting cup 34 has an opening at an upper end thereof, and the opening has a size larger than the turntable 26. Further, the first processing fluid supply unit 19 is connected to a lower end portion of the collecting cup 34. The processing fluid supplied onto the substrate 3 is collected by the collecting cup 34 and then drained out into the first processing fluid supply unit 19.

Figure 3:
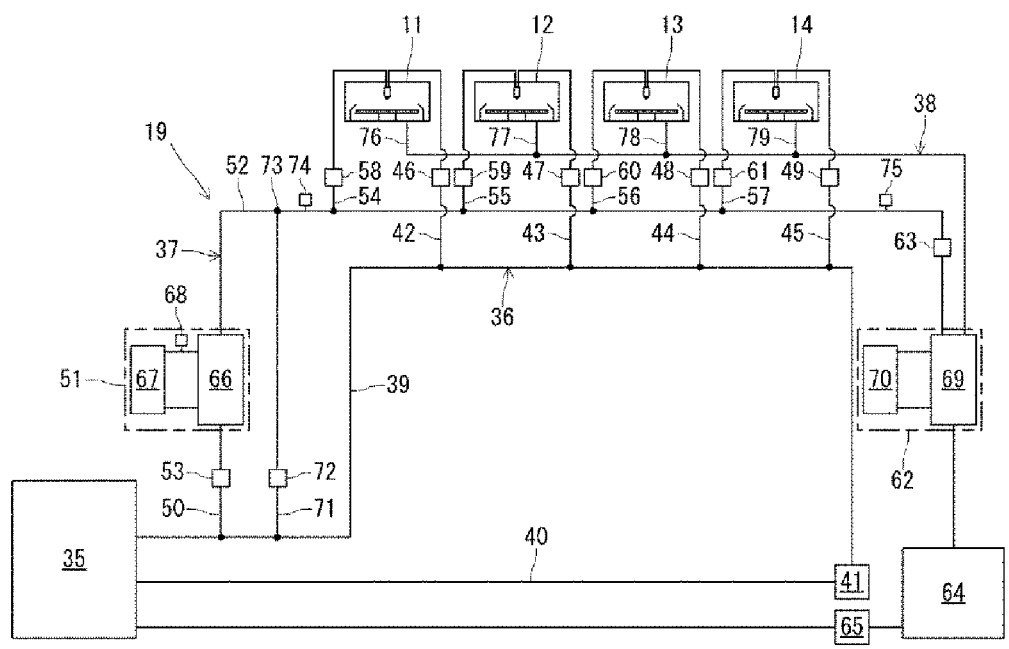
FIG. 3 is block diagram illustrating a processing fluid supply unit.

In the first processing fluid supply unit 19, as illustrated in FIG. 3, a storage tank 35, which stores therein the processing fluid at a room temperature, is connected with a non-heating circulation path 36, a heating circulation path 37 and a collecting path 38. The non-heating circulation path 16 is configured to circulate the processing fluid without heating the processing fluid. The heating circulation path 37 is configured to circulate the processing fluid after heating the processing fluid. The collecting path 38 is configured to collect the processing fluids from the first to fourth substrate processing units 11 to 14.

The non-heating circulation path 36 includes a forwarding circulation path 39 and a returning circulation path 40 connected to the storage tank 35. Further, a circulation pump 41 is provided between the forwarding circulation path 39 and the returning circulation path 40. Nozzles 32 of the first to fourth substrate processing units 11 to 14 are connected to the forwarding circulation path 39 via branch lines 42 to 45, respectively. Flow rate controllers 46 to 49 are connected to portions of the branch lines 42 to 45, respectively. The circulation pump 41 and the flow rate controllers 46 to 49 are controlled by the controller 21.

The non-heating circulation path 36 circulates the processing fluid of the room temperature stored in the storage tank 35 without heating the processing fluid, and supplies the processing fluid of the room temperature to the first to fourth processing units 11 to 14 when necessary.

The heating circulation path 37 includes a branch path 50 branched from the forwarding circulation path 39 of the non-heating circulation path 36; a heating heat exchange system 51 connected to the branch path 50; and a supply path 52 connected to the heating heat exchange system 51. A flow rate controller 53 is connected to a portion of the branch path 50. The nozzles 32 of the first to fourth substrate processing units 11 to 14 are connected to the supply path 52 via branch lines 54 to 57, respectively, and flow rate controllers 58 to 61 are connected to portions of the branch lines 54 to 57, respectively. The heating heat exchange system 51 and the flow rate controllers 53 and 58 to 61 are controlled by the controller 21.

Further, the heating circulation path 37 is also equipped with a cooling heat exchange system 62 which is connected to the supply path 52 via a flow rate controller 63. The cooling heat exchange system 62 and the storage tank 35 are connected via a buffer tank 64 and a circulation pump 65. The cooling heat exchange system 62, the flow rate controller 63 and the circulation pump 65 are controlled by the controller 21.

The heating heat exchange system 51 is configured to heat the processing fluid flowing within a heat exchanger 66 by a heating fluid supplied from a heating fluid supply source 67. The heating fluid supply source 67 is controlled by the controller 21. A temperature of the heating fluid supplied from the heating fluid supply source 67 is detected by a temperature sensor 68. Further, the cooling heat exchange system 62 is configured to cool the processing fluid flowing within a heat exchanger 69 by a cooling fluid supplied from a cooling fluid supply source 70. The cooling fluid supply source 70 is controlled by the controller 21. Further, a detailed configuration of the cooling heat exchange system 62 will be described below.

Further, the heating circulation path 37 also has a bypass path 71 branched from the forwarding circulation path 39 of the non-heating circulation path 36, and the bypass path 71 is connected to the supply path 52 at an upstream of the first to fourth substrate processing units 11 to 14. A flow rate controller 72 is connected to a portion of the bypass path 71. The flow rate controller 72 is controlled by the controller 21. A temperature sensor 74 is also provided at the supply path 52 to be located at a downstream of a joint portion 73 between the supply path 52 and the bypass path 71 and provided at the upstream of the first to fourth substrate processing units 11 to 14. A temperature sensor 75 is also provided on the supply path 52 at the downstream of the first to fourth substrate processing units 11 to 14.

Further, the heating circulation path 37 is configured to, after heating the room-temperature processing fluid stored in the storage tank 35 to a preset temperature, cool the heated processing fluid to a room temperature and circulate the cooled processing fluid. The heating circulation path 37 also supplies the processing fluid of a preset temperature to the first to fourth substrate processing units 11 to 14 when necessary.

The collecting path 38 connects the collecting cups 34 of the first to fourth substrate processing units 11 to 14 with the cooling heat exchange system 62 via branch lines 76 to 79, respectively.

The collecting path 38 collects the processing fluids of the room temperature or the preset temperature, which are supplied to the first to fourth substrate processing units 11 to 14 from the non-heating circulation path 36 or the heating circulation path 37, back into the storage tank 35 after cooling the processing fluids to the room temperature in the cooling heat exchange system 62.

As for the supply of the processing fluid from the first processing fluid supply unit 19 to the first to fourth substrate processing units 11 to 14, the processing fluid may be supplied to only one of the first to fourth substrate processing units 11 to 14 at a flow rate having a certain range or may be supplied to all of the first to fourth substrate processing units 11 to 14 concurrently at the same flow rate or different flow rates, depending on processing conditions of the substrates 3 within the first to fourth substrate processing units 11 to 14.

Now, the detailed configuration of the cooling heat exchange system 62 as the major component of the present disclosure will be described.

Figure 4:
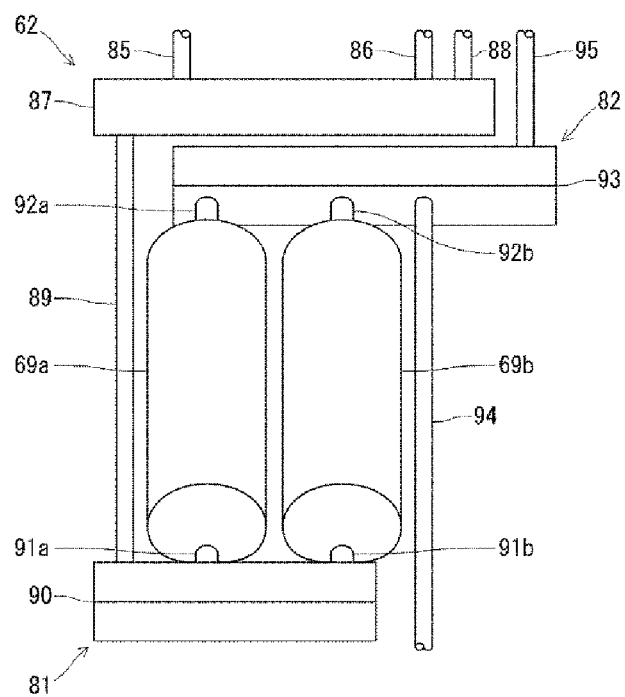
FIG. 4 is a front view of a cooling heat exchange system.
Figure 5:
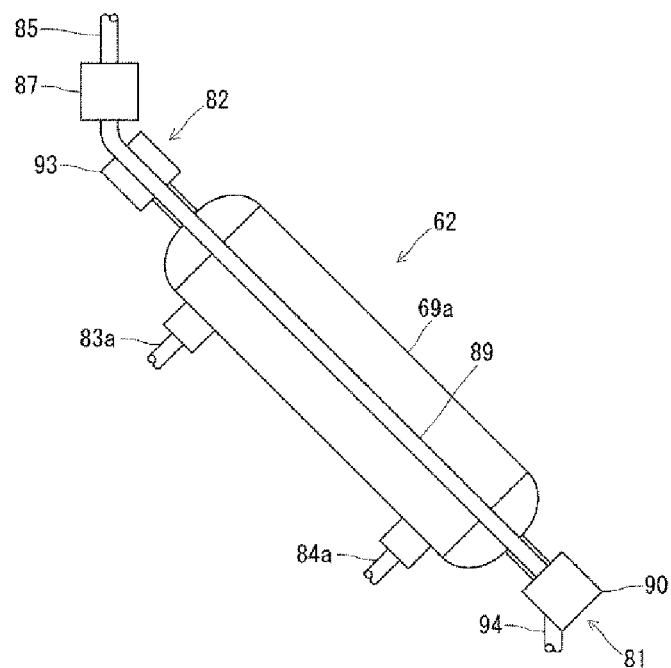
FIG. 5 is a left side view of the cooling heat exchange system.
Figure 6:
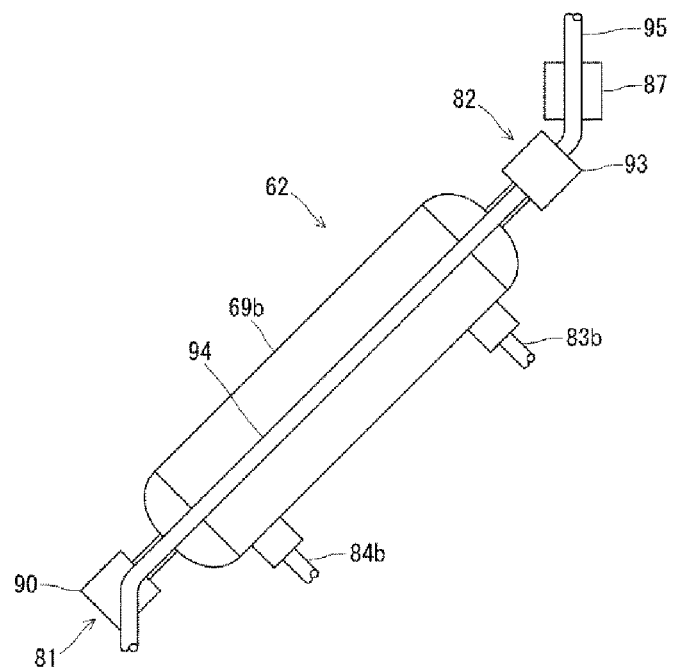
FIG. 6 is a right side view of the cooling heat exchange system.

The cooling heat exchange system 62 includes, as depicted in FIG. 3, the heat exchanger 69 and the cooling fluid supply source 70 connected to the heat exchanger 69. The heat exchanger 69 includes a pair of left and right heat exchangers 69a and 69b, as shown in FIG. 4 to FIG. 6. The heat exchangers 69a and 69b are connected with a fluid supply unit 81 configured to supply a cooling target processing fluid from the storage tank 35; and a fluid discharge unit 82 configured to discharge the cooled processing fluid into the storage tank 35.

The heat exchangers 69a and 69b are arranged side by side while standing obliquely in a vertical direction. By arranging the heat exchangers 69a and 69b in this inclined manner, the heat exchangers 69a and 69b can be accommodated even in a narrow vertical space. Cooling fluid inlet lines 83a and 83b are connected to rear upper portions of the heat exchangers 69a and 69b, respectively, and cooling fluid outlet lines 84a and 84b are connected to rear lower portions of the heat exchangers 69a and 69b, respectively. The cooling fluid inlet lines 83a and 83b and the cooling fluid outlet lines 84a and 84b are connected with the cooling fluid supply source 70, respectively. Accordingly, the cooling fluid supplied from the cooling fluid supply source 70 is introduced into the heat exchangers 69a and 69b through the cooling fluid inlet lines 83a and 83b, respectively. While the cooling fluid flows downwards within the heat exchangers 69a and 69b from the upper portions of the heat exchangers 69a and 69b toward the lower portions thereof, the cooling fluid cools the processing fluid. Then, the cooling fluid is drained out into the cooling fluid supply source 70 through the cooling fluid outlet lines 84a and 84b.

The lower portions of the heat exchangers 69a and 69b are connected with the fluid supply unit 81, and the upper portions of the heat exchangers 69a and 69b are connected with the fluid discharge unit 82.

Accordingly, within the heat exchangers 69a and 69b, the processing fluid supplied from the fluid supply unit 81 located below the heat exchangers 69a and 69b flows toward the fluid discharge unit 82 located above the heat exchangers 69a and 69b. When the processing fluid flows upwards within heat exchangers 69a and 69b from the lower portions thereof toward the upper portions thereof, the processing fluid is cooled by the cooling fluid. In this way, by allowing the cooling target processing fluid to be flown upwards from the lower portions of the heat exchangers 69a and 69b toward the upper portions thereof, it is possible to suppress a so-called "aeration" phenomenon that a gas flows into the heat exchangers 69a and 69b along with the processing fluid from occurring. Accordingly, the efficiency when cooling the processing fluid through the heat exchangers 69a and 69b can be improved.

The fluid supply unit 81 includes a first manifold 87 which is horizontally extended in a left-right direction. Lower end portions of left and right inlet lines 85 and 86, which are vertically extended, are connected to upper portions of the first manifold 87. Further, the first manifold 87 is provided at a position higher than upper ends of the heat exchangers 69a and 69b. The collecting path 38 communicating with the collecting cups 34 of the first to fourth substrate processing units 11 to 14 is coupled to the left inlet line 85, and the processing fluids after used in the first to fourth substrate processing units 11 to 14 flow within this inlet line 85. Further, the right inlet line 86 is connected with the heating circulation path 37, and a surplus processing fluid which is not supplied to the first to fourth substrate processing units 11 to 14 flows within this inlet line 86. Connected to a right upper end portion of the first manifold 87 is a gas exhaust line 88 configured to exhaust the gas mixed in the processing fluid. Further, a left lower end portion of the first manifold 87 is connected with an upper end portion of a single supply line 89 vertically extended in an inclined manner.

Accordingly, in the fluid supply unit 81, the processing fluids introduced from the left and right inlet lines 85 and 86 are allowed to be mixed with each other within the first manifold 87 and supplied into the heat exchangers 69a and 69b through the single supply line 89. At this time, in case that there exists a gas mixed into the processing fluid, the gas is exhausted through the gas exhaust line 88, so that the processing fluid is allowed to flow smoothly. The gas exhaust line 88 is connected to the first manifold 87 to be located at an upstream of the inlet lines 85 and 86 (i.e., the right upper end portion of the first manifold 87), and the first manifold 87 is inclined downwards from the upstream side toward the downstream side thereof. Thus, the gas can be exhausted more smoothly.

Further, the fluid supply unit 81 also includes a second manifold 90 which is horizontally extended in the left-right direction. A lower end portion of the supply line 89 is connected with a left upper end portion of the second manifold 90. Further, lower end portions of left and right branch lines 91a and 91b, which are vertically extended in an inclined manner, are connected to right upper portions of the second manifold 90, respectively. Upper end portions of the left and right branch lines 91a and 91b are connected to lower end portions of the left and right heat exchangers 69a and 69b, respectively.

Accordingly, in the fluid supply unit 81, the processing fluid introduced from the supply line 89 is branched within the second manifold 90 and is supplied into the left and right heat exchangers 69a and 69b through the two branch lines 91a and 91b, respectively. The supplied processing fluids are cooled by the left and right heat exchangers 69a and 69b, respectively. Further, the second manifold 90 may be inclined downwards from the upstream side toward the downstream side thereof. With this configuration, in case that a gas is mixed in the processing fluid, the gas can be easily exhausted from the gas exhaust line 88 provided at the upstream side.

The fluid discharge unit 82 includes left and right branch lines 92a and 92b which are vertically extended in an inclined manner. Lower end portions of the left and right branch lines 92a and 92b are connected with the upper end portions of the left and right heat exchangers 69a and 69b, respectively, and upper end portions of the left and right branch lines 92a and 92b are connected with a left lower portion of a third manifold 93 which is horizontally extended in the left-right direction. A right lower portion of the third manifold 93 is connected with an upper end portion of a single discharge line 94 which is vertically extended in an inclined manner. This discharge line 94 is connected with the storage tank 35 via the buffer tank 64 and the circulation pump 65. Further, a right upper end portion of the third manifold 93 is connected with a gas supply line 95 for supplying a gas to the processing fluid.

Accordingly, in the fluid discharge unit 82, the processing fluids cooled by the left and right heat exchangers 69a and 69b are introduced into the third manifold 93 through the left and right branch lines 92a and 92b, respectively, and discharged through the discharge line 94 after mixed in the third manifold 93. At this time, if a flow rate of the processing fluid decreases or the flow of the processing fluid stops, Siphon principle may be applied to between the supply line 89 and the discharge line 94. As a result, a liquid surface within the supply line 89 may be decreased, so that a gas may be introduced into the heat exchangers 69a and 69b. By supplying the gas from the gas supply line 95, however, Siphon principle can be suppressed, so that it is possible to suppress the gas from being introduced into the heat exchangers 69a and 69b.

Further, in the above-described cooling heat exchange system 62, the length of the flow path through which the processing fluid flows between the supply line 89 of the fluid supply unit 81 and the discharge line 94 of the fluid discharge unit 82 is set to be same in both cases where the processing fluid flows from the supply line 89 into the discharge line 94 through the left heat exchanger 69a and the processing fluid flows from the supply line 89 into the discharge line 94 through the right heat exchanger 69b. Accordingly, the processing fluid can be flown into the left and right heat exchangers 69a and 69b uniformly, and, thus, the processing fluid can be flown smoothly.

The substrate processing apparatus 1 is configured as described above and is controlled by the controller 21 (computer) to perform a preset process on the substrate 3 according to various kinds of programs recorded in a storage medium 80 installed in the controller 21. Here, the storage medium 80 stores thereon various kinds of setup data or programs and may be implemented by a memory such as a ROM or a RAM, or a disk-type storage medium such as a hard disk, a CD-ROM, DVD-ROM or a flexible disk, as commonly known in the art.

The substrate processing apparatus 1 performs a process on the substrate 3 according to a substrate processing program recorded in the storage medium 80, as will be described below.

In the substrate processing apparatus 1, the processing fluid of the room temperature stored in the storage tank 35 is supplied to the first to fourth substrate processing units 11 to 14 after heated to a preset temperature, and the processing fluid which is used in the first to fourth substrate processing units 11 to 14 and the surplus processing fluid which is not supplied to the first to fourth substrate processing units 11 to 14 are collected back into the storage tank 35 after cooled to the room temperature. By using the heated processing fluid, the function of the processing fluid can be improved, so that a required process can be performed on the substrate 3 effectively. Further, by storing the heated processing fluid after cooling it, deterioration of the processing fluid by heat can be suppressed, so that a subsequent process can be performed on the substrate 3 effectively.

To elaborate, by driving the circulation pump 65 of the heating circulation path 37, the processing fluid is circulated from the storage tank 35 through the forwarding circulation path 39, the heating heat exchange system 51 and the bypass path 71, the supply path 52, the cooling heat exchange system 62, the buffer tank 64 and the circulation pump 65 consecutively in sequence, and, then, returned back into the storage tank 35. At this time, by driving the heating heat exchange system 51, the heating fluid is supplied into the heat exchanger 66 from the heating fluid supply source 67, and the processing fluid is heated within the heat exchanger 66 and then supplied to the joint portion 73 of the supply path 52. Not only the processing fluid heated by the heating heat exchange system 51 is supplied to the joint portion 73, but the fluid of the room temperature is also supplied to this joint portion 73 through the bypass path 71. Accordingly, the heated processing fluid and the processing fluid of the room temperature are mixed at the joint portion 73 and flown through the supply path 52 at a temperature higher than the room temperature. This processing fluid is later cooled to the room temperature by the cooling heat exchange system 62 and then returned back into the storage tank 35.

In the cooling heat exchange system 62, the processing fluids after used in the first to fourth substrate processing units 11 to 14 are introduced into the first manifold 87 from the left inlet line 85 by a weight of the processing fluid, and the surplus processing fluid which is not supplied to the first to fourth substrate processing units 11 to 14 is introduced into the first manifold 87 from the right inlet line 86 by the weight of the surplus processing fluid. Thereafter, these processing fluids are mixed within the first manifold 87, and the mixed processing fluid are introduced into the second manifold 90 through the supply line 89. Afterwards, the processing fluids are branched within the second manifold 90 and the branched processing fluids are supplied into the lower portions of the left and right heat exchangers 69a and 69b through the branch lines 91a and 91b, respectively.

Then, in the cooling heat exchange system 62, the processing fluids supplied into the lower portions of the heat exchangers 69a and 69b are flown upwards within the heat exchangers 69a and 69b from the lower portions of the heat exchangers 69a and 69b toward the upper portions thereof and then discharged out from the upper portions of the heat exchangers 69a and 69b, respectively. The processing fluids are cooled by the cooling fluid while they are being flown upwards within the heat exchangers 69a and 69b from the lower portions of the heat exchangers 69a and 69b toward the upper portions thereof.

Thereafter, in the cooling heat exchange system 62, the processing fluids cooled by the heat exchangers 69a and 69b are introduced into the third manifold 93 through the branch lines 92a and 92b, respectively. Then, the processing fluids are mixed with each other within the third manifold 3 and discharged out through the discharge line 94.

As stated above, the substrate processing apparatus 1 includes the cooling heat exchange system 62 configured to cool the processing fluid for processing the substrate 3. The cooling heat exchange system 62 includes the heat exchanger 69 configured to cool the processing fluid passing through the heat exchanger 69; the fluid supply unit 81 configured to supply the cooling target processing fluid into the lower portion of the heat exchanger 69; and the fluid discharge unit 82 configured to discharge the cooled processing fluid from the upper portion of the heat exchanger 69. The fluid supply unit 81 includes the inlet lines 85 and 86 through which the processing fluid is introduced into the fluid supply unit 81; the first manifold 87 located above the upper end portions of the heat exchangers 69a and 69b and connected with the inlet lines 85 and 86; the gas exhaust line 88 connected to the first manifold 87 and configured to exhaust the gas mixed in the processing fluid; and the supply line 89 configured to supply the processing fluid into the heat exchanger 69 from the first manifold 87. In the substrate processing apparatus 1 having the above-described configuration, while passing through the heat exchanger 69 from the lower portion of the heat exchanger 69 toward the upper portion thereof, the processing fluid is cooled by the cooling heat exchange system 62.

Therefore, in the substrate processing apparatus 1 having the above-described configuration, it is possible to suppress a gas from being introduced into the heat exchanger 69 when the cooling target processing fluid is flown into the heat exchanger 69. Thus, the efficiency of cooling the processing fluid by the heat exchanger 69 can be improved. Especially, in the case where the processing fluid is supplied to the lower portion of the heat exchanger 69 by the weight of the processing fluid, an additional pump need not be provided. Hence, without causing increase of cost or space for the additional pump, the processing fluid can be supplied to the heat exchanger 69 rapidly.

Further, in the above-described substrate processing apparatus 1, the example embodiment has been applied to the cooling heat exchange system 62. However, the example embodiment is not limited thereto and can also be applied to the heating heat exchange system 51. In addition, in the above-described example embodiment, the plating liquid is used as the processing fluid. However, the example embodiment is not limited thereto and may also be applied to substrate processing apparatuses using various kinds of processing fluids such as a cleaning liquid, a rinse liquid and an etching liquid which are used after heated to or cooled to a preset temperature.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A heat exchange system, comprising:
   at least one heat exchanger configured to heat or cool a fluid passing therethrough;
   a fluid supply unit configured to supply the heating target fluid or the cooling target fluid into a lower portion of the at least one heat exchanger; and
   a fluid discharge unit configured to discharge the heated fluid or the cooled fluid from an upper portion of the at least one heat exchanger,
   wherein the fluid supply unit comprises:
   at least one inlet line through which the fluid is introduced;
   a first manifold provided at a position higher than an upper end of the at least one heat exchanger and connected with the at least one inlet line;
   a gas exhaust line connected to an upper end portion of the first manifold and configured to exhaust a gas that is mixed into the fluid to remove the gas from the fluid and to allow the fluid to flow smoothly; and
   a supply line configured to supply the fluid into the at least one heat exchanger from the first manifold,
   the fluid is heated or cooled while passing through an inside of the at least one heat exchanger upwards from the lower portion of the at least one heat exchanger toward the upper portion thereof, and
   the fluid discharge unit comprises: a third manifold into which the heated fluid or the cooled fluid by the at least one heat exchanger is introduced; and a gas supply line connected to an upper end portion of the third manifold and configured to supply a gas into the heated fluid or the cooled fluid.

2. The heat exchange system of claim 1, wherein the fluid supply unit is configured to supply the fluid into the lower portion of the at least one heat exchanger by a weight of the fluid.

3. The heat exchange system of claim 1, wherein the at least one inlet line is plural in number, and the fluid supply unit comprises the inlet lines through which the fluid is introduced; the first manifold connected with the inlet lines; and the supply line configured to supply the fluid into the at least one heat exchanger from the first manifold.

4. The heat exchange system of claim 1, wherein the at least one heat exchanger is plural in number, and the fluid supply unit comprises the supply line configured to supply the fluid; a second manifold connected with the supply line; and branch lines branched from the second manifold and configured to supply the fluid into the heat exchangers, respectively.

5. The heat exchange system of claim 1, wherein the at least one heat exchanger is plural in number, the fluid discharge unit further comprises branch lines connected to the heat exchangers, respectively; and a single discharge line connected to the third manifold, and the third manifold is connected with the branch lines.

6. The heat exchange system of claim 1, wherein the fluid supply unit comprises the supply line configured to supply the fluid; a second manifold connected with the supply line; and branch lines branched from the second manifold and configured to supply the fluid into the heat exchangers, respectively, the fluid discharge unit further comprises branch lines connected to the heat exchangers, respectively; and a discharge line connected to the third manifold, the third manifold is connected with the branch lines, and lengths of flow paths of the fluids flowing from the supply line to the discharge line in all of the heat exchangers are set to be the same.

7. A substrate processing apparatus having a heat exchange system of heating or cooling a fluid for processing a substrate,
   wherein the heat exchange system comprises:
   a heat exchanger configured to heat or cool a fluid passing therethrough;
   a fluid supply unit configured to supply the heating target fluid or the cooling target fluid into a lower portion of the heat exchanger; and
   a fluid discharge unit configured to discharge the heated fluid or the cooled fluid from an upper portion of the heat exchanger,
   the fluid supply unit comprises:
   an inlet line through which the fluid is introduced;
   a first manifold provided at a position higher than an upper end of the heat exchanger and connected with the inlet line;
   a gas exhaust line connected to an upper end portion of the first manifold and configured to exhaust a gas that is mixed into the fluid to remove the gas from the fluid and to allow the fluid to flow smoothly; and
   a supply line configured to supply the fluid into the heat exchanger from the first manifold, and
   the fluid is heated or cooled while passing an inside of the heat exchanger upwards from the lower portion of the heat exchanger toward the upper portion thereof, and the fluid discharge unit comprises: a third manifold into which the heated fluid or the cooled fluid by the at least one heat exchanger is introduced; and a gas supply line connected to an upper end portion of the third manifold and configured to supply a gas into the heated fluid or the cooled fluid.

8. The substrate processing apparatus of claim 7,
wherein the fluid supply unit is configured to supply the fluid used in a substrate processing unit configured to process a substrate into the lower portion of the heat exchanger by a weight of the fluid.

\* \* \* \* \*